US009859357B1

(12) United States Patent
Deligianni et al.

(10) Patent No.: US 9,859,357 B1
(45) Date of Patent: Jan. 2, 2018

(54) MAGNETIC INDUCTOR STACKS WITH MULTILAYER ISOLATION LAYERS

(71) Applicant: International Business Machines Corporation, Armonk, NY (US)

(72) Inventors: Hariklia Deligianni, Alpine, NJ (US); Bruce B. Doris, Hartsdale, NY (US); Eugene J. O'Sullivan, Nyack, NY (US); Naigang Wang, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/209,803

(22) Filed: Jul. 14, 2016

(51) Int. Cl.
*H01L 49/02* (2006.01)
*H01L 23/522* (2006.01)

(52) U.S. Cl.
CPC .......... *H01L 28/10* (2013.01); *H01L 23/5227* (2013.01); *H01L 28/26* (2013.01); *H01L 28/40* (2013.01)

(58) Field of Classification Search
CPC ..... H01L 28/10; H01L 28/40; H01L 23/5227; H01L 23/481
See application file for complete search history.

(56) References Cited

U.S. PATENT DOCUMENTS

| 5,763,108 A * | 6/1998 | Chang | G11B 5/3109 |
| | | | 204/192.2 |
| 9,035,422 B2 | 5/2015 | Khanolkar et al. | |
| 2001/0050607 A1 * | 12/2001 | Gardner | H01F 17/0006 |
| | | | 336/200 |
| 2002/0114932 A1 * | 8/2002 | Yoshikawa | B32B 18/00 |
| | | | 428/210 |
| 2003/0005572 A1 * | 1/2003 | Gardner | H01F 17/0006 |
| | | | 29/602.1 |
| 2003/0213615 A1 * | 11/2003 | Utsumi | H05K 3/4655 |
| | | | 174/257 |
| 2006/0091958 A1 * | 5/2006 | Bhatti | H03F 3/211 |
| | | | 330/295 |
| 2007/0030659 A1 * | 2/2007 | Suzuki | H01F 17/0013 |
| | | | 361/793 |
| 2010/0000780 A1 * | 1/2010 | Zhu | H01B 11/1895 |
| | | | 174/350 |
| 2010/0019332 A1 * | 1/2010 | Taylor | G01R 33/07 |
| | | | 257/427 |
| 2014/0159850 A1 * | 6/2014 | Roy | H01F 17/0013 |
| | | | 336/200 |

(Continued)

FOREIGN PATENT DOCUMENTS

JP   2010080774 A   4/2010

*Primary Examiner* — Nathan W Ha
(74) *Attorney, Agent, or Firm* — Cantor Colburn LLP; Vazken Alexanian

(57) ABSTRACT

A magnetic laminating structure and process includes alternating layers of a magnetic material and a multilayered insulating material, wherein the multilayered insulating material is intermediate adjacent magnetic material layers and comprises a first insulating layer abutting at least one additional insulating layer, wherein the first insulating layer and the at least one additional insulating layer comprise different dielectric materials and/or are formed by a different deposition process, and wherein the layers of the magnetic material have a cumulative thickness greater than 1 micron.

10 Claims, 2 Drawing Sheets

(56) References Cited

U.S. PATENT DOCUMENTS

| | | |
|---|---|---|
| 2015/0048918 A1 | 2/2015 | Park et al. |
| 2015/0109088 A1 | 4/2015 | Kim et al. |
| 2015/0279545 A1* | 10/2015 | Fazelpour ......... H01L 23/49822 336/192 |
| 2016/0005527 A1 | 1/2016 | Park et al. |
| 2016/0086721 A1 | 3/2016 | Park et al. |

* cited by examiner

MAGNETIC INDUCTOR STACKS WITH MULTILAYER ISOLATION LAYERS

BACKGROUND

The present invention relates to on-chip magnetic devices, and more specifically, to on-chip magnetic structures and methods for minimizing magnetic losses for magnetic inductors.

On-chip magnetic inductor stacks are important passive elements with applications in the fields such as on-chip power converters and radio frequency (RF) integrated circuits. In order to achieve the high energy storage required for power management, on-chip inductors typically require relatively thick magnetic yoke materials (e.g., several microns or more).

Magnetic inductor stacks generally include alternating layers of magnetic material and dielectric material. The dielectric material helps prevent eddy current losses. The dielectric material used in the magnetic inductor stacks is generally deposited at low temperatures in order not to destroy the magnetic properties of the magnetic material. Low temperature oxides and nitrides have been used in the past but are prone to have pinholes, which can allow magnetic materials from adjacent layers to be electrically connected and unwanted eddy currents resulting in magnetic loss. The pinholes are particularly problematic for low temperature high throughput dielectric processes.

SUMMARY

Exemplary embodiments include inductor structures and methods for forming the inductor structures In one or more embodiments, the inductor structure includes a plurality of metal lines; and a laminated film stack comprising alternating layers of a magnetic material and a multilayered insulating material enclosing the metal lines, wherein the multilayered insulating material is intermediate adjacent magnetic material layers and comprises a first insulating layer abutting at least one additional insulating layer, and wherein the first insulating layer and the at least one additional insulating layer comprise different dielectric materials and/or are formed by a different deposition process.

In one or more embodiments, a method of forming an inductor structure includes depositing a laminated film stack comprising alternating layers of a magnetic material and a multilayered insulating material, wherein the multilayered insulating material is intermediate adjacent magnetic material layers and comprises a first insulating layer abutting at least one additional insulating layer, and wherein the first insulating layer and the at least one additional insulating layer comprise different dielectric materials and/or are formed by a different deposition process.

In one or more embodiments, the inductor structure includes a laminated film stack comprising alternating layers of a magnetic material and a multilayered insulating material, wherein the multilayered insulating material is intermediate adjacent magnetic material layers and comprises a first insulating layer abutting at least one additional insulating layer, and wherein the first insulating layer and the at least one additional insulating layer comprise different dielectric materials and/or are formed by a different deposition process.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features and advantages of the invention are apparent from the following detailed description taken in conjunction with the accompanying drawings in which:

Prior Art FIG. 1 ("FIG") illustrates a cross section of an inductor structure.

DETAILED DESCRIPTION

The present invention addresses problems in the prior art by providing in one or more embodiments a method and a magnetic inductor structure that eliminates issues resulting from pinhole formation in the dielectric layer while advantageously being low temperature and high throughput. The methods and structure eliminate the effects of pinhole formation by utilizing a multilayer isolation scheme. In one or more embodiments, the multilayer isolation scheme can be performed by depositing two or more layers of different dielectric materials intermediate adjacent magnetic layers in the magnetic inductor laminate structure. While each deposited dielectric layer can include pinholes, it has been discovered that the pinholes between layers is discontinuous. By way of example, the multilayer isolation scheme can include depositing a first layer of silicon dioxide followed by deposition of silicon nitride followed by deposition of silicon dioxide. In other examples, one can deposit a silicon nitride/silicon dioxide/silicon nitride stack. In addition, the stack can be fabricated using more than two different types of dielectric materials. By utilizing the multilayer isolation scheme, the multilayer dielectric can have an overall thinner film thickness compared to a single layer dielectric while overcoming issues associated with pinholes. In addition, the thinner film provides lower aspect ratio for ease of downstream processing.

Figure 1:
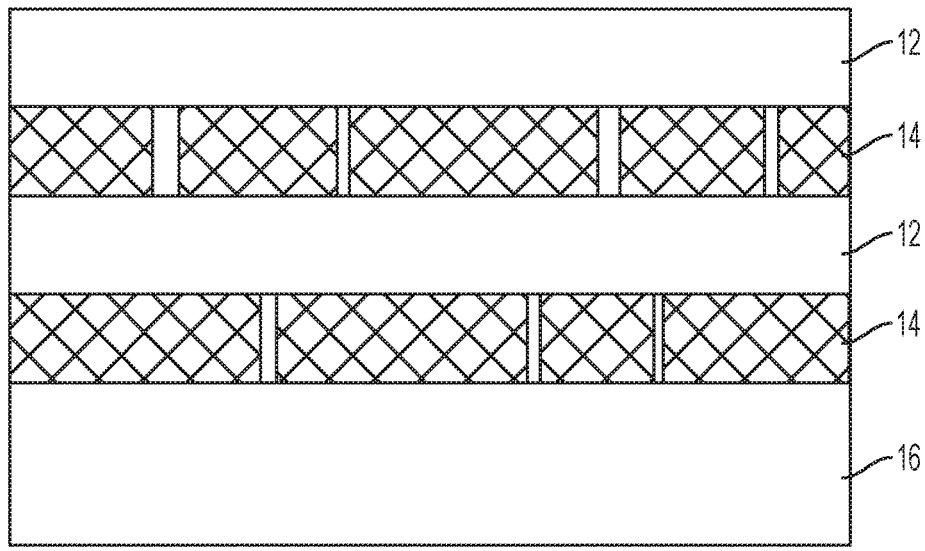

Prior art FIG. 1 illustrates a known magnetic inductor structure 10 illustrating one of the problems associated with low temperature deposition of dielectric materials. By low temperature deposition, it is meant that the temperatures utilized to deposit the dielectric material within the magnetic inductor structure are generally at temperatures that do not affect the magnetic properties associated with the magnetic layers, which is generally less than 300° C. although the particular temperature will generally depend on the deposition process. The exemplary magnetic inductor structure 10 includes a substrate 12 upon which the inductor structure is formed. Substrate 12 can be a processed wafer. A "processed wafer" is herein defined as a wafer that has undergone semiconductor front end of line processing (FEOL) middle of the line processing (MOL), and back end of the line processing (BEOL), wherein the various desired devices and circuits have been formed.

The typical FEOL processes include wafer preparation, isolation, well formation, gate patterning, spacer, extension and source/drain implantation, silicide formation, and dual stress liner formation. The MOL is mainly gate and source-drain contact formation, which is an increasingly challenging part of the whole fabrication flow, particularly for lithography patterning. The state-of-the-art semiconductor chips, the so called 14 nm node of Complementary Metal-Oxide-Semiconductor (CMOS) chips, in mass production features a second generation three dimensional (3D) FinFET, a metal one pitch of about 55 nm and copper (Cu)/low-k (and air-gap) interconnects. In the BEOL, the Cu/low-k interconnects are fabricated predominantly with a dual damascene process using plasma-enhanced CVD (PECVD) deposited interlayer dielectric (ILDs), PVD Cu barrier and electrochemically plated Cu wire materials.

Disposed on the substrate 12 are alternating layers of dielectric material 14 and magnetic material 16, wherein the cumulative thickness of the magnetic material is greater than 1 micron to several microns. As discussed above, one of the problems with current low temperature deposition processes of dielectric materials used in the formation of magnetic inductor film stacks includes the formation of pinholes 18 randomly formed during deposition of the dielectric material layers. The pinholes can extend from a bottom surface to a top surface of the dielectric layer or partially therethrough, which deleteriously results in unwanted electrical connections between adjacent magnetic layers and eddy currents that cause magnetic loss.

The low temperature deposition processes are varied and generally include physical vapor deposition (PVD), chemical vapor deposition (CVD), plasma enhanced chemical vapor deposition (PECVD), thermal oxidation, or any combination thereof. The temperatures of these various deposition processes also vary depending on the particular process. In one or more embodiments, the dielectric deposition process includes PECVD at temperatures of less than 300° C.

In one or more other embodiments, the second dielectric layer (and/or each additional dielectric layer) can be formed of a different material (e.g., silicon nitride) compared to the first dielectric layer (e.g., silicon dioxide) while the deposition technique is the same $114^{n=1}$. In one or more other embodiments, the second layer (and/or each additional dielectric layer) can be the same material as the first material (e.g., silicon dioxide) but utilizes different deposition techniques, e.g., PECVD, PVD, spin-on and atomic layer deposition). In one or more other embodiments, the materials for the first and second dielectric layers are different and the deposition technique to form each layer is different.

Figure 2:
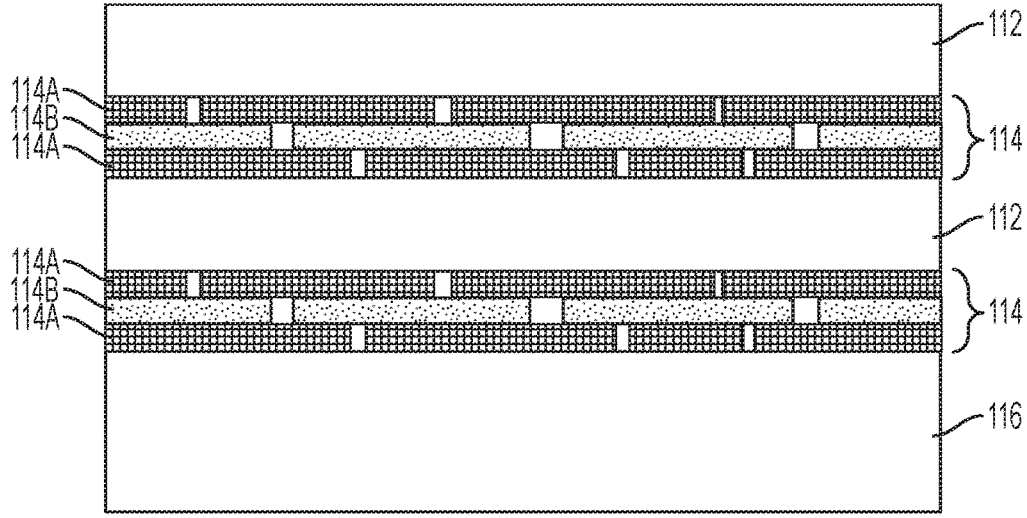
FIG. 2 illustrates a cross section of an inductor structure including multilayer isolation layers in accordance with the present invention.

Turning now to FIG. 2, there is depicted a cross section of an exemplary inductor structure in accordance with one or more embodiments of the present invention. The inductor structure 100 generally includes a plurality of alternating magnetic layers 112 and insulating layers 114 disposed on a substrate 116 such as a processed wafer.

Each of the insulating layers 114 comprises multiple dielectric layers 114A, 114B deposited utilizing a low temperature deposition process particular to the dielectric material and process the dielectric material is being deposited. At least two or more of the dielectric layers 114A and 114B within a multilayer isolation scheme are formed of different materials or by different deposition techniques. As used herein, the term multilayer isolation scheme generally refers to two or more dielectric layers, wherein at least two of the dielectric materials are different. While each deposited layer can include pinholes, it has been discovered that the pinholes between layers is discontinuous. Thus, eddy current losses between adjacent magnetic layers that were previously effected by pinhole formation in the dielectric layer are prevented. The maximum number of dielectric layers between adjacent magnetic layers is not intended to be limited and is generally limited by the desired thickness of the insulating layer wherein minimal thickness to electrically isolate the magnetic layers is generally desired while preventing eddy current losses. Generally, the utilization of multiple dielectric layers 114A to 114B instead of a single insulating layer permits thinner layer thickness as well as an overall lower aspect ratio for the magnetic stack, which is desirable as components become smaller and smaller.

The multiple dielectric layers 114A to 114B are not intended to be limited to any specific material and can include dielectric materials such as oxides, nitrides, and the like. Exemplary oxides include, but are not limited to, silicon dioxide ($SiO_2$), thermal oxide Si, silicon oxynitride ($SiO_xN_y$), magnesium oxide (MgO), aluminum oxide ($AlO_2$) and/or ($Al_2O_3$), boron oxide ($B_2O_3$), tantalum oxide ($Ta_2O_5$), titanium oxide ($TiO_2$), or the like. Exemplary nitrides include silicon nitride.

The bulk resistivity and the eddy current loss of the magnetic structure can be controlled by the multilayer dielectric layer 114. As noted above, the cumulative thickness of the insulating layer 114 in its entirety (i.e., thickness of the multiple dielectric layers 114A to 114B that define the particular insulating layer 114A, 114B) should be minimal and is generally at a thickness effective to electrically isolate the magnetic layer upon which it is disposed from other magnetic layers in the film stack. Generally, the insulating layer 114A, 114B has a thickness of about 1 nanometer to about 500 nanometers and can be at least about one half or more of the magnetic layer thickness. In one or more embodiments, the thickness of the insulator layer is about 2 to about 100 nanometers.

Each of the magnetic layers 112 in the laminate stack 100 can have a thickness of about 100 nanometers or more and can be deposited through vacuum deposition technologies (i.e., sputtering) or electrodepositing through an aqueous solution. Vacuum methods have the ability to deposit a large variety of magnetic materials and to easily produce laminated structures. However, they usually have low deposition rates, poor conformal coverage, and the derived magnetic films are difficult to pattern. Electroplating has been a standard technique for the deposition of thick metal films due to its high deposition rate, conformal coverage and low cost.

The magnetic layers are not intended to be limited to any specific material and can include CoFe, CoFeB, CoZrTi, CoZrTa, CoZr, CoZrNb, CoZrMo, CoTi, CoNb, CoHf, CoW, FeCoN, FeCoAlN, CoP, FeCoP, CoPW, CoBW, CoPBW, FeTaN, FeCoBSi, FeNi, CoFeHfO, CoFeSiO, CoZrO, CoFeAlO, combinations thereof, or the like. Inductor core structures from these materials have generally been shown to have low eddy losses, high magnetic permeability, and high saturation flux density.

The magnetic inductor including the laminate structure as described can be integrated in a variety of devices. Two basic configurations are closed yoke and solenoid structure inductors. The closed yoke has copper wire with magnetic material wrapped around it and the solenoid inductor has magnetic material with copper wire wrapped around it. Both inductor types benefit by having very thick magnetic materials, wherein the total magnetic film thickness requirement is typically greater than 1 micrometer (m).

A non-limiting example of inductor integration is a transformer, which can include metal lines (conductors) formed parallel to each other by standard silicon processing techniques directed to forming metal features. The inductor structures can be formed about the parallel metal lines to form a closed magnetic circuit and to provide a large inductance and magnetic coupling among the metal lines. The inclusion of the magnetic material and the substantial or complete enclosure of the metal lines can increase the magnetic coupling between the metal lines and the inductor for a given size of the inductor. Inductors magnetic materials are also useful for RF and wireless circuits as well as power converters and EMI noise reduction.

Figure 3:
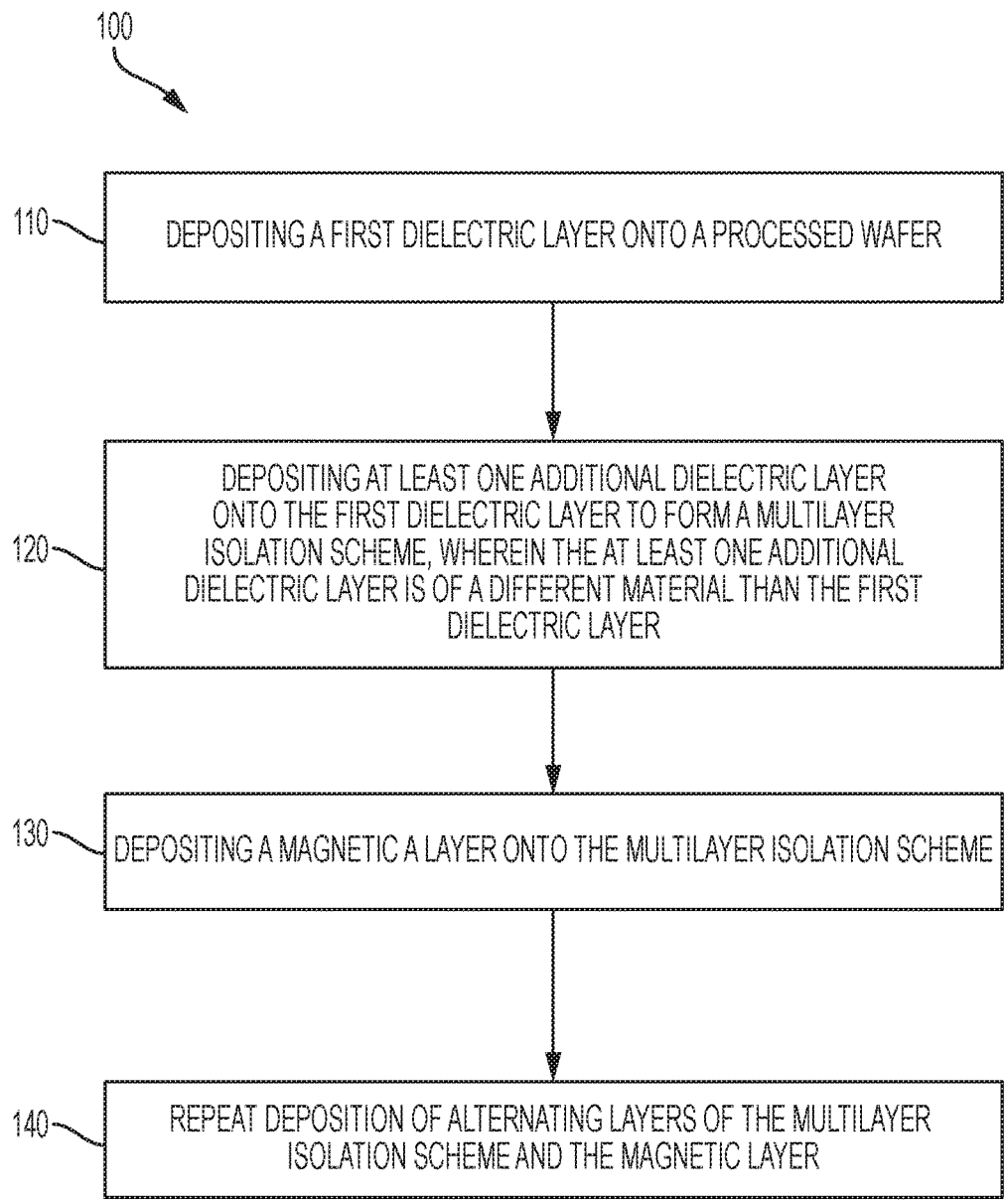
FIG. 3 is a process flow for forming an inductor structure in accordance with one or more embodiments of the present invention.

Referring now to FIG. 3, a process 100 of forming the on chip magnetic inductor is shown and generally begins with a first step 110 of depositing a first dielectric layer 114A onto the processed wafer 116, which after FEOL, MOL, and BEOL processing has a planar uppermost surface.

In step 120, a second dielectric layer 114B is then deposited onto the first dielectric layer 114A. The second dielectric layer 114B can be formed of a different material. Optionally, one or more additional dielectric layers can be deposited onto the second dielectric layer 114B, which is a different material than the second dielectric layer 114B. In one or more embodiments, the additional dielectric layer is formed of the same material as the first dielectric layer 114A. In one or more other embodiments, the second dielectric layer 114B (and/or each additional dielectric layer) can be formed of a different material than the first dielectric layer 114A while the deposition technique used to form the second dielectric layer 114B is the same as the deposition method used to form the first dielectric layer 114A. In one or more other embodiments, the second layer (and/or each additional dielectric layer) can be the same material but utilizes different deposition technique. In one or more other embodiments, the materials for the first and second dielectric layers 114A, 114B are different and the deposition technique to form each layer is different.

As shown in step 130, once the desired thickness of the dielectric layer 114A, 114B is formed, a magnetic layer 112 is deposited onto the uppermost dielectric layer. The preceding process steps are repeated to provide alternating magnetic layer and multilayer isolation schemes until the desired magnetic inductor structure is formed, which includes a magnetic film having a total thickness in excess of 1 micron. By utilizing a laminate structure including the multilayer isolation scheme as described, eddy current losses between adjacent magnetic layers is prevented.

Once the desired laminate structure is formed, the process can further include deposition of a hard mask onto the laminate structure followed by lithography to complete the device, wherein lithography can then be performed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated It should be apparent that there can be many variations to this diagram or the steps (or operations) described herein without departing from the spirit of the invention. For instance, the steps can be performed in a differing order or steps can be added, deleted or modified. All of these variations are considered a part of the claimed invention.

While the preferred embodiment to the invention had been described, it will be understood that those skilled in the art, both now and in the future, can make various improvements and enhancements which fall within the scope of the claims which follow. These claims should be construed to maintain the proper protection for the invention first described.

What is claimed is:

1. An inductor structure comprising:
a plurality of metal lines; and
a laminated film stack comprising alternating layers of a magnetic material and a multilayered insulating material enclosing the metal lines, wherein the multilayered insulating material is intermediate adjacent magnetic material layers and comprises a first insulating layer abutting at least one additional insulating layer, and wherein the first insulating layer and the at least one additional insulating layer comprise different dielectric materials and/or are formed by a different deposition process.

2. The inductor structure of claim 1, wherein the first insulating layer and/or the at least one additional insulating layer comprises one or more pinholes and are discontinuous between the first insulating layer and the at least one additional insulating layer.

3. The inductor structure of claim 1, wherein the magnetic material is selected from the group consisting of CoFe, CoFeB, CoZrTi, CoZrTa, CoZr, CoZrNb, CoZrMo, CoTi, CoNb, CoHf, CoW, FeCoN, FeCoAlN, CoP, FeCoP, CoPW, CoBW, CoPBW, FeTaN, FeCoBSi, FeNi, CoFeHfO, CoFeSiO, CoZrO, CoFeAlO, and combinations thereof.

4. The inductor structure of claim 1, wherein the dielectric materials are selected from the group consisting of silicon dioxide, thermal oxide Si, silicon oxynitride, magnesium oxide, aluminum oxide, boron oxide, tantalum oxide, titanium oxide, silicon nitride, and combinations thereof.

5. The inductor structure of claim 1, wherein the multilayered insulating material layer has a thickness of about one half of a thickness of the magnetic material layer.

6. The inductor structure of claim 1, wherein the multilayered insulating material layer has a thickness effective to electrically isolate each magnetic material layer from other magnetic material layers in the inductor structure.

7. The inductor structure of claim 1, wherein first insulating layer comprises silicon dioxide and the insulating layer abutting at least one additional comprises insulating layer silicon nitride.

8. The inductor structure of claim 1, wherein the multilayered insulating material layer comprises a first silicon dioxide layer overlaying a silicon nitride layer, wherein the silicon nitride layer overlays a second silicon dioxide layer.

9. The inductor structure of claim 1, wherein the multilayered insulating material layer comprises a first silicon nitride layer overlaying a silicon dioxide layer, wherein the silicon dioxide layer overlays a second silicon nitride layer.

10. An inductor structure, comprising:
a laminated film stack comprising alternating layers of a magnetic material and a multilayered insulating material, wherein the multilayered insulating material is intermediate adjacent magnetic material layers and comprises a first insulating layer abutting at least one additional insulating layer, and wherein the first insulating layer and the at least one additional insulating layer comprise different dielectric materials and/or are formed by a different deposition process.

* * * * *